United States Patent
Tao et al.

(10) Patent No.: US 10,580,616 B2
(45) Date of Patent: Mar. 3, 2020

(54) SYSTEM AND METHOD FOR IN-SITU BEAMLINE FILM STABILIZATION OR REMOVAL IN THE AEF REGION

(71) Applicant: Axcelis Technologies, Inc., Beverly, MA (US)

(72) Inventors: Teng-Chao David Tao, Saugus, MA (US); David Allen Kirkwood, Arlington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/152,439

(22) Filed: Oct. 5, 2018

(65) Prior Publication Data

US 2019/0108972 A1 Apr. 11, 2019

Related U.S. Application Data

(60) Provisional application No. 62/569,846, filed on Oct. 9, 2017.

(51) Int. Cl.

| | |
|---|---|
| *H01J 37/30* | (2006.01) |
| *H01J 37/317* | (2006.01) |
| *H01J 37/305* | (2006.01) |
| *H01J 37/05* | (2006.01) |

(52) U.S. Cl.
CPC .......... *H01J 37/3053* (2013.01); *H01J 37/05* (2013.01); *H01J 37/3171* (2013.01); *H01J 2237/006* (2013.01); *H01J 2237/022* (2013.01); *H01J 2237/057* (2013.01); *H01J 2237/31701* (2013.01)

(58) Field of Classification Search
CPC .... H01J 37/3053; H01J 37/05; H01J 37/3171; H01J 2237/006; H01J 2237/022; H01J 2237/057; H01J 2237/31701
See application file for complete search history.

(56) References Cited

U.S. PATENT DOCUMENTS

| | | |
|---|---|---|
| 5,554,854 A | 9/1996 | Blake |
| 5,879,574 A * | 3/1999 | Sivaramakrishnan ...................... C23C 16/4405 134/1.1 |

(Continued)

OTHER PUBLICATIONS

International Search Report and Written Opinion dated Jan. 21, 2019 in connection with International Application No. PCT/US2018/054963.

*Primary Examiner* — David E Smith
(74) *Attorney, Agent, or Firm* — Eschweiler & Potashnik, LLC

(57) ABSTRACT

An ion implantation system has an ion source configured form an ion beam and an angular energy filter (AEF) having an AEF region. A gas source passivates and/or etches a film residing on the AEF by a reaction of the film with a gas. The gas can be an oxidizing gas or a fluorine-containing gas. The gas source can selectively supply the gas to the AEF region concurrent with a formation of the ion beam. The AEF is heated to assist in the passivation and/or etching of the film by the gas. The heat can originate from the ion beam, and/or from an auxiliary heater associated with the AEF. A manifold distributor can be operably coupled to the gas source and configured to supply the gas to one or more AEF electrodes.

20 Claims, 6 Drawing Sheets

(56) References Cited

U.S. PATENT DOCUMENTS

| | | | |
|---|---|---|---|
| 6,221,169 B1 * | 4/2001 | Bernstein | H01J 37/317 |
| | | | 134/1 |
| 6,777,696 B1 | 8/2004 | Rathmell | |
| 6,881,966 B2 | 4/2005 | Beveniste | |
| 7,022,984 B1 * | 4/2006 | Rathmell | H01J 37/05 |
| | | | 250/305 |
| 2007/0075274 A1 * | 4/2007 | Reece | H01J 37/3171 |
| | | | 250/492.21 |
| 2010/0065761 A1 | 3/2010 | Graf | |
| 2010/0154835 A1 * | 6/2010 | Dimeo | C23C 14/564 |
| | | | 134/31 |
| 2015/0214007 A1 * | 7/2015 | Ooura | H01J 37/3171 |
| | | | 250/492.21 |
| 2015/0371822 A1 * | 12/2015 | Amano | H01J 37/244 |
| | | | 250/397 |
| 2016/0365225 A1 * | 12/2016 | Anglin | H01J 37/32862 |

* cited by examiner

SYSTEM AND METHOD FOR IN-SITU BEAMLINE FILM STABILIZATION OR REMOVAL IN THE AEF REGION

REFERENCE TO RELATED APPLICATIONS

This application is a U.S. Non-Provisional Application which claims the benefit of U.S. Provisional Application Ser. No. 62/569,846 filed Oct. 9, 2017, entitled "SYSTEM AND METHOD FOR IN-SITU BEAMLINE FILM STABILIZATION OR REMOVAL IN THE AEF REGION", the contents of which are herein incorporated by reference in their entirety.

TECHNICAL FIELD

The present invention relates generally to ion implantation systems, and more specifically to systems and methods for stabilizing films formed on beamline components in an ion implantation system, as well as systems, apparatuses and methods for cleaning and removal of the film from an angular energy filter of the ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

SUMMARY

The present disclosure is directed generally toward systems and methods for ion implantation including passivating and/or cleaning films formed on components associated therewith. More particularly, the present disclosure is directed toward systems and methods for stabilization and/or removal of films formed on components of an ion implantation system via chemical reactions from introducing a high volume reacting gas and heating of the components via an ion beam or an auxiliary heat source.

Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with one exemplary aspect, an ion implantation system is provided, wherein the ion implantation system comprises an ion source configured to form an ion beam. In one example, one or more components, such as an angular energy filter (AEF), is provided in the ion implantation system, wherein the AEF has an AEF region associated therewith. A gas source, for example, if further provided and configured to supply a gas to the AEF region, wherein the gas is configured to passivate and/or etch a film residing on the AEF via a reaction of the film with the gas. The gas source, for example, comprises one or more of an oxidizing gas source and a fluorine-containing gas source configured to selectively supply a respective oxidizing gas and fluorine-containing gas to the AEF region. In one example, the fluorine-containing gas comprises one or more of $NF_3$ and $XeF_2$ and the oxidizing gas comprises one or more of air and water.

The gas source, for example, is configured to selectively supply the gas to the AEF region concurrent with a formation of the ion beam, and wherein heat associated with the ion beam is configured to heat the AEF to assist in the passivation and/or etching of the film residing on the AEF. In another example, an auxiliary heater configured to selectively heat the AEF, thereby assisting in the passivation and/or etching of the film residing on the AEF.

In another example, a manifold distributor is associated with the AEF, wherein the AEF comprises one or more AEF electrodes. The manifold distributor, for example, is operably coupled to the gas source and configured to supply the gas to the one or more AEF electrodes. The manifold distributor, for example, comprises a tube having a plurality of holes defined therein, wherein the plurality of holes are configured to disperse the gas to the one or more AEF electrodes.

In accordance with another example, a method is provided for mitigating a deposition of a film on one or more components of an ion implantation system, wherein the method comprises supplying a gas to one or more regions associated with the respective one or more components, and wherein the gas is configured to passivate and/or etch the film residing on the one or more components via a reaction of the film with the gas. Heat associated with an ion beam, for example, may be configured to heat the one or more components to assist in the passivation and/or etching of the film residing on the one or more components. Alternatively, or in addition, heat may be provided to the one or more components via an auxiliary heater.

The ion implantation system may be further evacuated, thereby removing one or more byproducts of the reaction of the film with the gas from the ion implantation system. In one example, the gas may be supplied in-situ.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
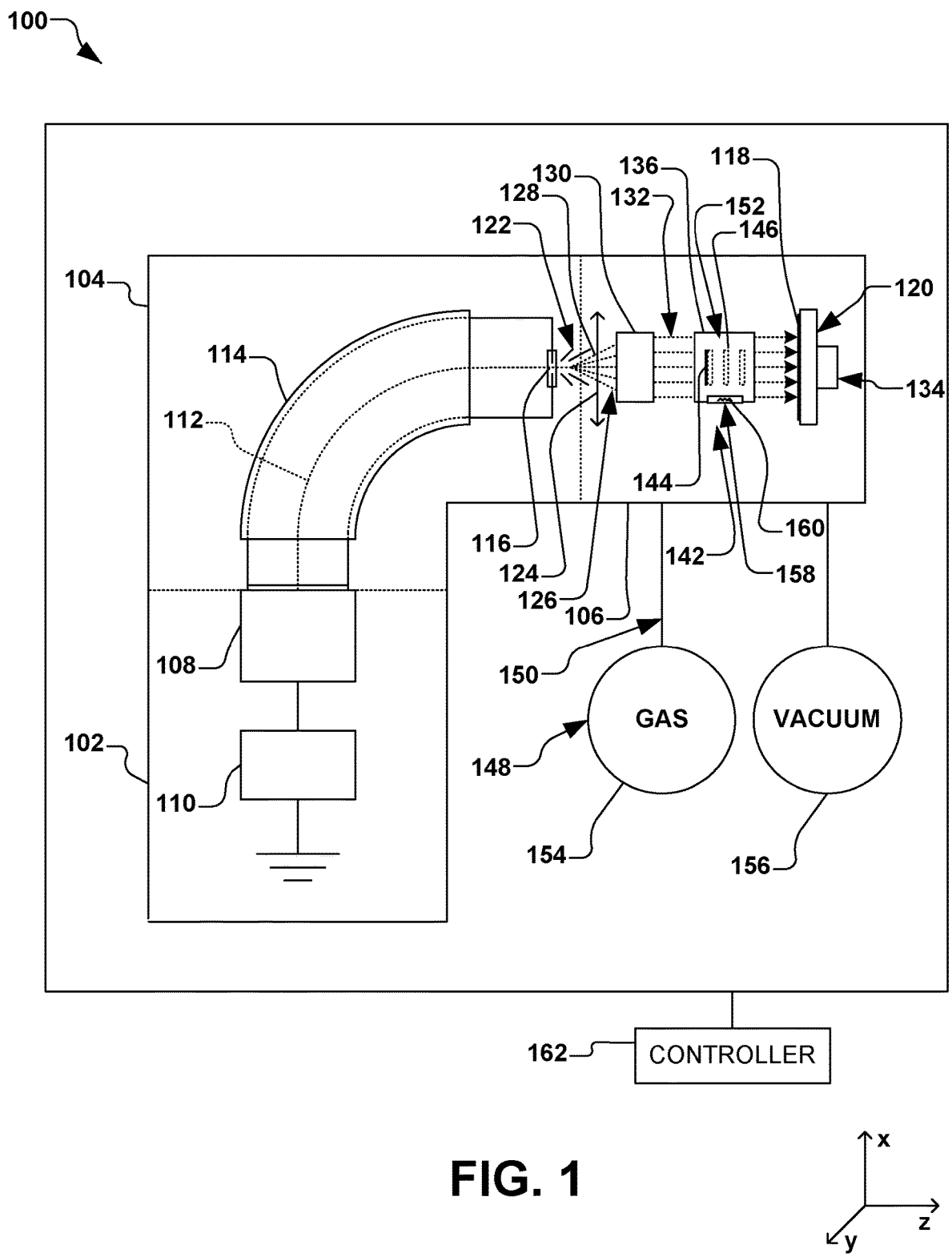
FIG. 1 is a block diagram of an exemplary vacuum system in accordance with several aspects of the present disclosure.

The present disclosure is directed generally toward an apparatus, system, and method for ion implantation including passivating and/or cleaning films formed on components associated therewith. More particularly, the present disclosure is directed toward systems and methods for stabilization and/or removal of films formed on one or more components of an ion implantation system via chemical reactions from an introduction of a high volume reacting gas to a region associated with the one or more components and concurrent heating of the one or more components, such as via an ion beam. In particular, the one or more components may comprise electrodes or other components in an Angular Energy Filter (AEF) region of a beamline of the ion implantation system. The disclosure thus may be advantageously integrated as a part of normal operations of the ion implantation system, whereby the stabilization and/or removal of the films may be performed in-situ or during scheduled preventive maintenance.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Referring now to the figures, in accordance with one aspect of the present disclosure, FIG. 1 illustrates an exemplary ion implantation system 100. The ion implantation system 100, for example, comprises a terminal 102, a beamline assembly 104, and an end station 106. Generally speaking, an ion source 108 in the terminal 102 is coupled to a power supply 110 to ionize a dopant gas into a plurality of ions and to form an ion beam 112. The ion beam 112 in the present example is directed through a mass analyzer 114, and out an aperture 116 towards the end station 106. In the end station 106, the ion beam 112 impacts a workpiece 118 (e.g., a semiconductor workpiece such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. In a preferred embodiment, the ion beam 112 comprises a spot beam, wherein the spot beam is scanned via a beam scanner 122 positioned downstream of the aperture 116. The beam scanner 122, for example, electrostatically or magnetically scans the ion beam 112 along a first axis 124 (e.g., in the x-direction) to generally define a scanned ion beam 126 comprising a plurality of beamlets 128. The plurality of beamlets 128 of the ion beam 112 (e.g., the scanned ion beam 126) can be further parallelized downstream of the beam scanner 122 via a parallelizer 130, thus defining a scanned and parallelized ion beam 132. Furthermore, a workpiece scanner 134 can be utilized to scan the workpiece 118 through the ion beam 112 (e.g., the workpiece is mechanically scanned through the scanned and parallelized ion beam 132 in the y-direction).

Figure 2:
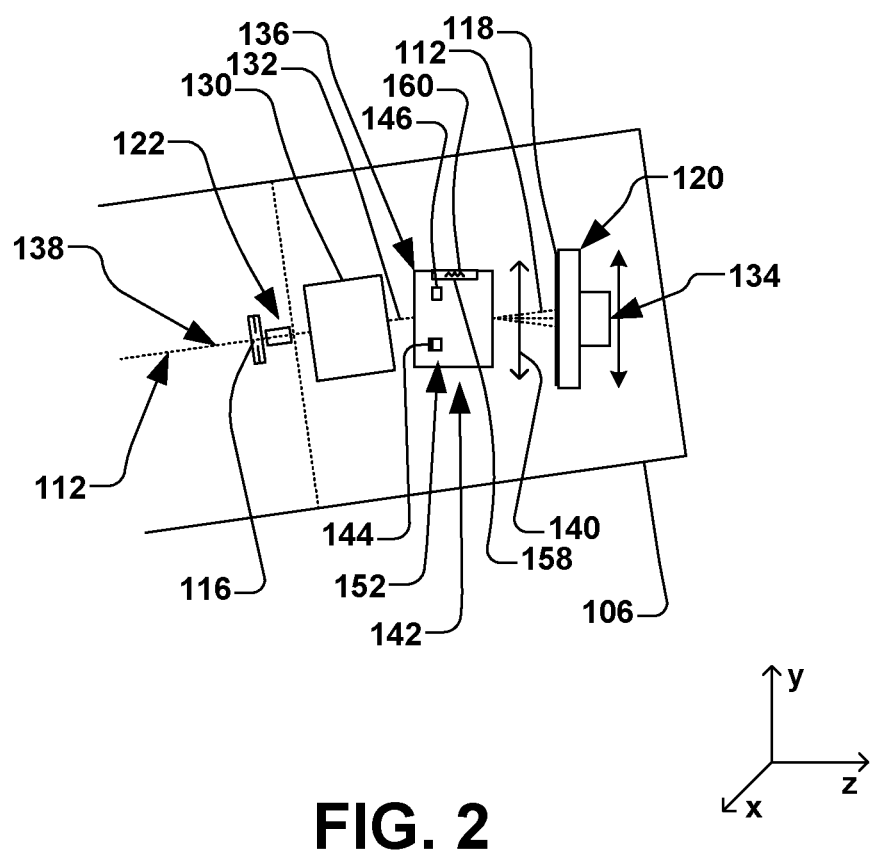
FIG. 2 is a block diagram an exemplary angular energy filter (AEF) in accordance with another aspect of the present disclosure.

The present disclosure further implements an angular energy filter (AEF) 136 that is provided in the ion implantation system 100. For example, the AEF 136 can comprise one or more features provided in the Purion Ion Implantation System manufactured by Axcelis Technologies, Inc. of Beverly, Mass. The AEF 136, as illustrated in FIG. 2, for example, is configured to receive the scanned and parallelized ion beam 132 and subsequently deflect the ion beam from an incoming beamline axis 138 along a second axis 140 (e.g., in the vertical or y-direction) toward the workpiece 118 in order to prevent neutral particles from reaching the workpiece.

For example, commonly-owned U.S. Pat. No. 6,881,966 to Benveniste et al., which is incorporated by reference in its entirety herein, discloses a magnetic deflector employed in conjunction with an electrostatic deflector to form a hybrid deflection system. In the hybrid deflection system, a magnetic deflector module is employed for deflection at generally low ion beam energies, while an electrostatic deflection module is employed at generally higher beam energies. The AEF 136, such as the AEF shown in FIGS. 1-5, for example, may be disposed in an AEF region 142 of FIG. 1 and controlled to vary the trajectory of the ion beam 112 as a function of the energy thereof, and to deflect desired ions to be implanted from neutral ions traveling along the path of travel of the ion beam. Additional disclosures of AEF systems, for example, can be found in commonly-owned U.S. Pat. Nos. 6,777,696 and 7,022,984 to Rathmell et al., and U.S. Patent Publication No. 2010/0065761 to Graf et al., and are also incorporated by reference herein in their entireties.

The present disclosure appreciates that one or more films 144 may be formed on various components 146 (e.g., electrodes, apertures, or other beamline components) of the ion implantation system 100 during operation thereof, particularly in the AEF region 142 associated with the AEF 136, as shown schematically in FIG. 1. The present disclosure advantageously stabilizes, passivates, or otherwise aids in a removal of the one or more films 144 formed on the various components 146 of the ion implantation system 100 via inducing one or more chemical reactions with the one or more films. The disclosure thus provides an integrated solution for mitigating various deleterious issues caused by the one or more films 144 associated with normal ion implanter operation, such as contamination of the workpiece 118 caused by delamination or degradation of the one or more films 144.

In one example, a gas feed system 148 is provided, wherein the gas feed system is associated with the AEF region 142 and configured to supplying one or more gases 150 (e.g., one or more of an oxidizing gas and a reactive gas) into an AEF environment 152 associated with the AEF region in order to passivate or etch one or more films 144 that may have developed therein. The one or more gases 150, for example, may comprise a high-volume reacting gas that is introduced to the ion implantation system 100 by a gas source 154. In one example, the ion beam 112 may provide heat to the various components 146 on which the one or more films 144 have been formed, such that the heat from the ion beam assists in the passivation or removal of the one or more films 144 from the various components in conjunction with the reaction with one or more gases 150.

In accordance with one example, the one or more gases 150 supplied by the gas source 154 comprise an oxidizing gas, such as air and/or water (e.g., water vapor), whereby the oxidizing gas may be introduced along with heat (e.g., from the ion beam 112) in order to passivate the one or more films 144, thus generally stabilizing the one or more films and mitigating further contamination associated therewith. For example, the AEF 136 (or various components thereof) may be further heated via a strike from the ion beam 112, thus passivating the one or more films 144.

In another example, the one or more gases 150 supplied by the gas source 154 comprise a fluorine-containing gas (e.g., $NF_3$, $XeF_2$ or other gas containing fluorine), whereby the fluorine-containing gas may be optionally combined with heat (e.g., from the ion beam 112) to etch the one or more films 144, whereby the resulting reacted gas is further removed from the ion implantation system 100 via a vacuum source 156 shown in FIG. 1. The vacuum source 156 (e.g., a vacuum pump), for example, may be provided for further generally evacuating the ion implantation system 100.

In another example, an auxiliary heating source 158 may be provided for enhancing and/or accelerating the above-described passivation or reaction process associated with the one or more gases 150, whereby the auxiliary heating source is associated with, or incorporated into, the various components 146, such as the AEF 136. Accordingly, the heating of the one or more films 144, for example, may be provided by one or more of the ion beam 112 and the auxiliary heating source 158. The auxiliary heating source 158, for example, may comprise one or more heaters 160 (e.g., one or more resistive heaters, conductive heaters, fluid-based heaters, radiative heaters, etc.) associated with the AEF 136.

Furthermore, a controller 162 is illustrated in FIG. 1, wherein the controller is operable to control some or all of the ion implantation system 100, such as one or more of the AEF 136, beam scanner 122, gas source 154, vacuum source 156, auxiliary heating source 158, and/or various other components of the ion implantation system.

Figure 3:
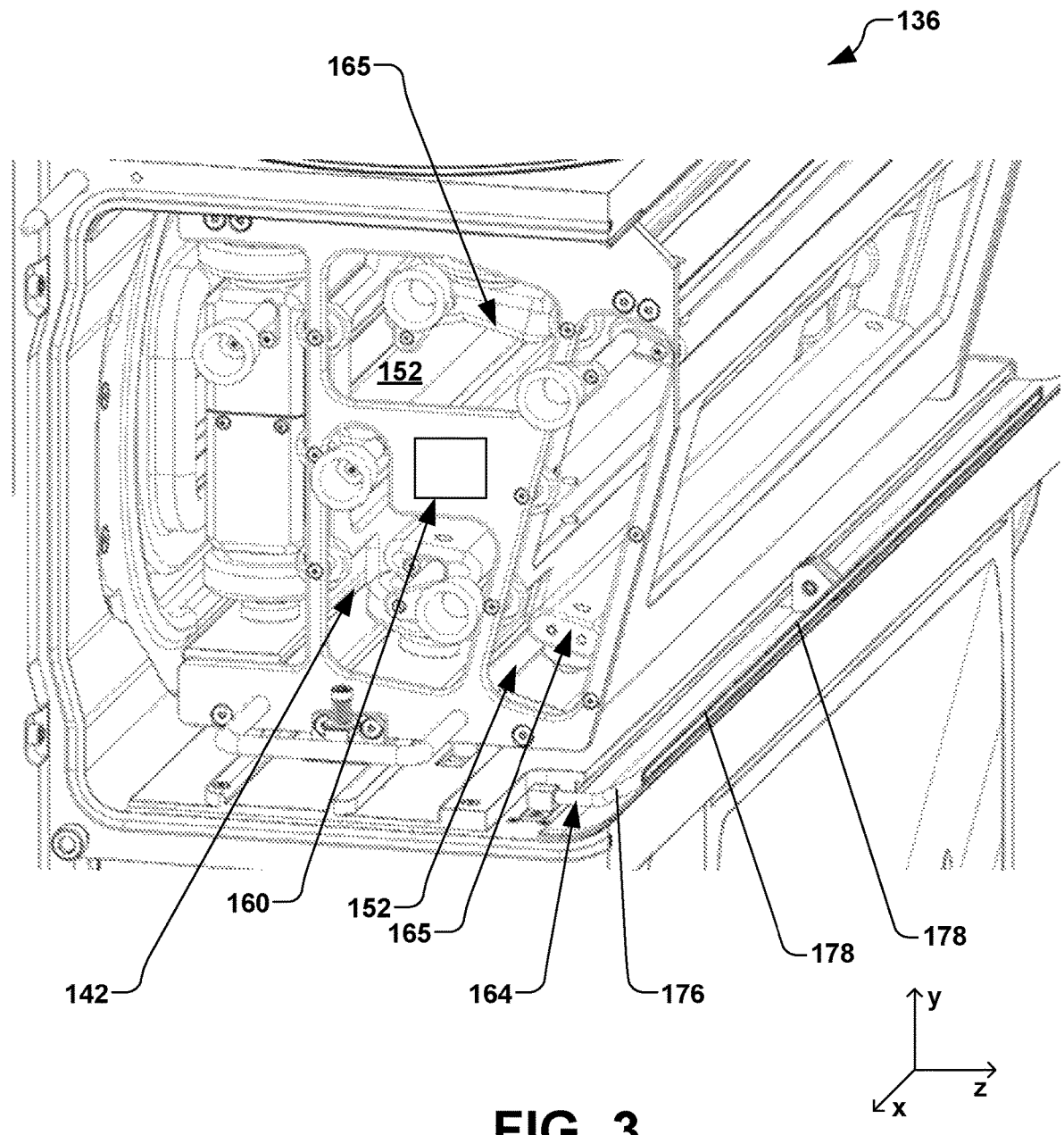
FIG. 3 illustrates a perspective view an exemplary AEF in accordance with yet another aspect of the present disclosure.
Figure 4:
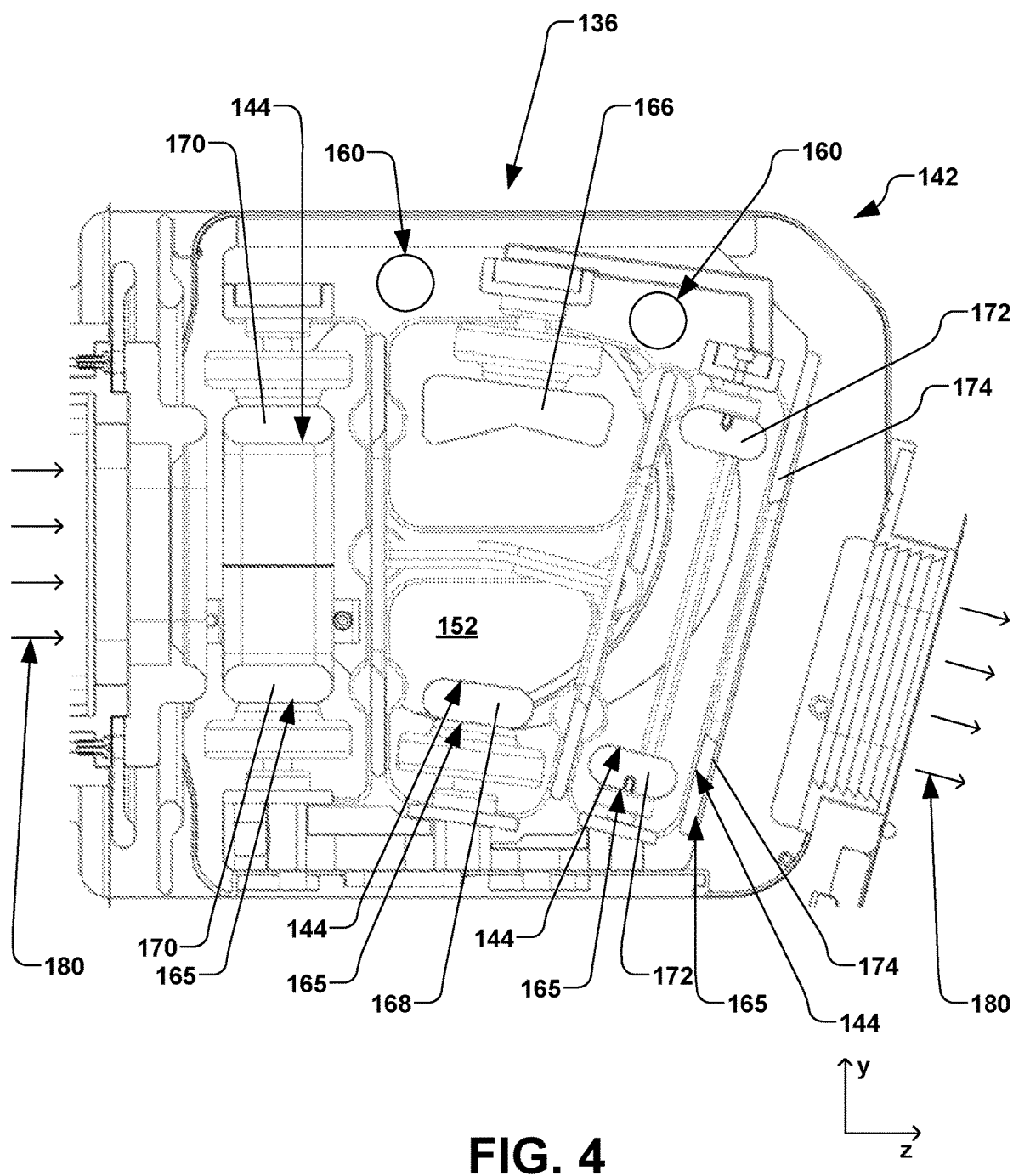
FIG. 4 illustrates a side view of an exemplary AEF in accordance with still another aspect of the present disclosure.
Figure 5:
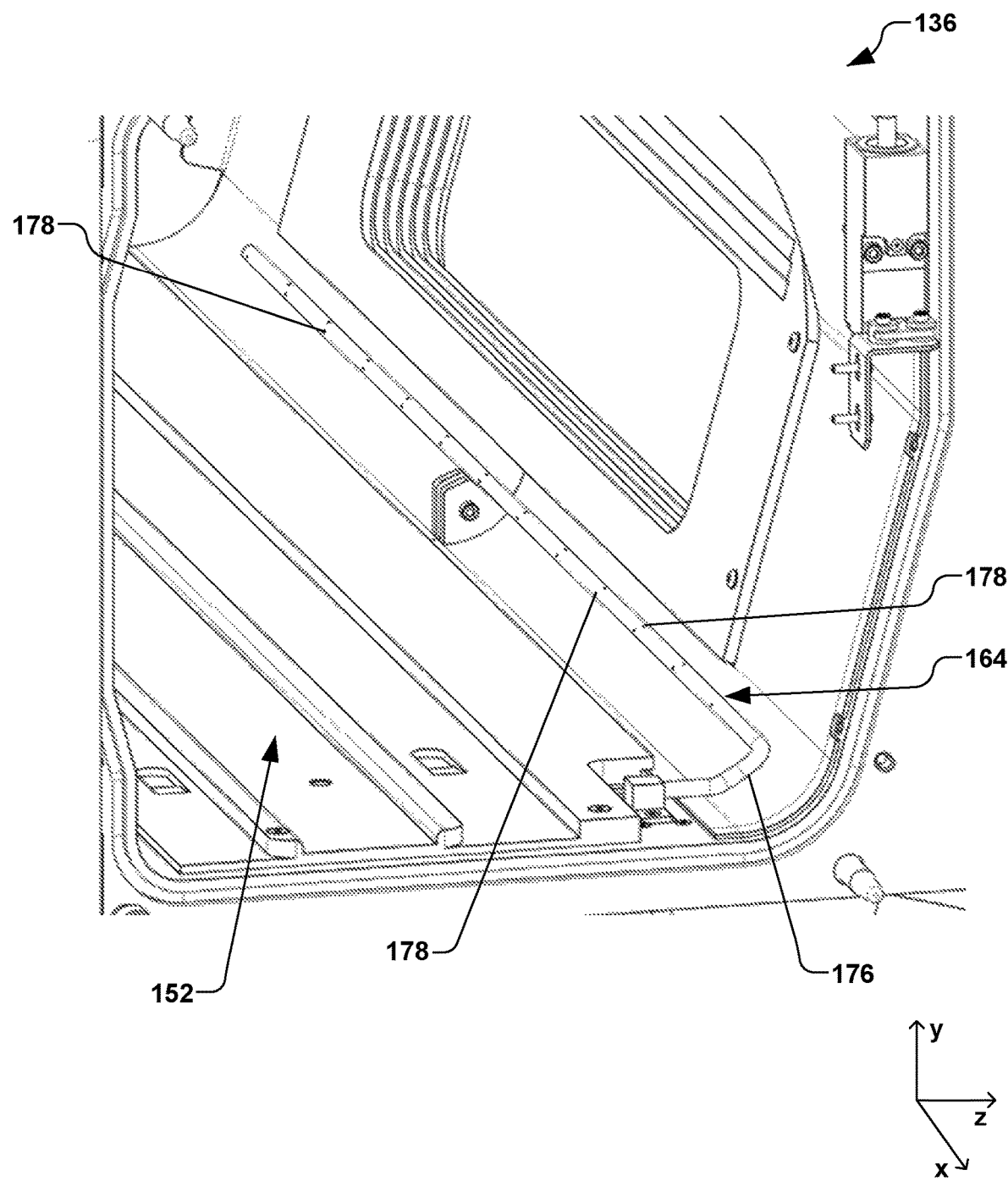
FIG. 5 illustrates a perspective view of an exemplary AEF with a gas manifold in accordance with another aspect of the present disclosure.

In accordance with yet another example of the present disclosure, the one or more gases 150 of FIG. 1 are delivered through a manifold distributor 164 as illustrated in FIG. 3. The manifold distributor 164, for example, is configured to provide a generally uniform flow of the one or more gases 150 across the various components 146, such as across one or more AEF electrodes 165 associated with the AEF 136 of FIG. 3. As illustrated in FIG. 4, for example, the one or more AEF electrodes 165 may comprise one or more of an AEF top plate 166, AEF bottom plate 168, terminal suppression electrode 170, AEF suppression electrodes 172, and AEF ground aperture 174.

The manifold distributor 164 of FIG. 3, for example, may comprise a tube 176 having a plurality of holes 178 defined therein, wherein the manifold distributor is operably coupled to the gas source 154 of FIG. 1 to provide a dispersion of the one or more gases 150 to various AEF electrodes 165 in the AEF environment 152. The plurality of holes 178, for example, are shown in greater detail in FIG. 5, whereby the plurality of holes may be offset by a predetermined angle (e.g., 45 degrees) to provide a dispersion of the one or more gases 150 (e.g., fluorine-containing gas, air, and/or water vapor) of FIG. 1.

In yet another example, a high-power ion beam 180 (e.g., the ion beam 112 of FIG. 1) may be swept across the AEF electrodes 165 shown in FIG. 4, whereby heat associated with the high-power ion beam assists in reacting the one or more gases 150 of FIG. 1 with the one or more films 144. Alternatively, or in addition, the one or more heaters 160 shown in FIGS. 1-4 (e.g., one or more resistive heaters, conductive heaters, fluid-based heaters, radiative heaters, etc.) may be configured to accelerate the chemical reaction process described above. As shown in FIG. 4, for example, the high-power ion beam 180 may be swept in orthogonal directions, such as both vertical and horizontal directions (e.g., the ion beam is scanned into and out of the paper, while extending vertically to a maximum width).

Accordingly, the present disclosure further provides a technique of in-situ cleaning of the AEF 136 and/or other components of the ion implantation system 100 to provide passivation and/or removal the one or more films 144 formed therein. The present disclosure may be further integrated into software, for example, whereby the cleaning may be activated as part of preventive maintenance (PM), system Post-Vent Conditioning (PVC), or a purge cleaning routine.

In accordance with another exemplary aspect, the present disclosure improves low-energy particle performance in various ion implantation systems, such as the ion implantation system 100 of FIG. 1. When running an ion beam 112 at low energy, for example, the ion implantation can have a tendency to accumulate the one or more films 144 on the various components 146 to the point where the various components become saturated by the implant species that is being implanted. Over time, the one or more films 144 may delaminate or otherwise cause defects on the workpiece 118 associated with the built-up particles and can lead to point defects. The system and apparatus of the present disclosure can, for example, advantageously provide air or moist air to the various components 146 to mitigate such defects. For example, over a period of time, when particle contamination builds up, air or moist air may be introduced via the gas feed system 148 whereby the one or more films 144 may be stabilized through an oxidation process. Venting to atmosphere, for example, can further recover particle performance. The present disclosure, for example, can deliberately introduce air to the system 100 in predetermined intervals concurrent with forming the ion beam 112, thus oxidizing and/or passivating the one or more films 144.

Alternatively, a different chemistry, such as a fluorinated gas, can convert the one or more films 144 to etch the one or more films instead of passivating the films. The AEF region 142, for example, is particularly exposed to changes in a size of the ion beam 112, whereby cleaning or stabilization can have a greater impact. Further, by introducing heat during the implant, as discussed above, film removal or cleaning/passivation processes can be increased or accelerated. A purge routine, for example, can be implemented to introduce the one or more gases 150 to periodically clean the ion implantation system 100. The purge routine, for example, may be instituted as preventive maintenance or between implants, whereby the purge routine can be executed to stabilize the beamline, thus stabilizing the surfaces of the various components 146 where the ion beam 112 passes.

The present disclosure contemplates implantation for any surface in the ion implantation system 100 where it is desirable to mitigate shedding of particles from the one or more films 144. The present disclosure contemplates passivating the one or more films 144 with water and/or air, and can alternatively or in addition include etching the one or more films with the fluorine-containing gas to remove the film altogether. The passivation discussed above, for example, may be performed a predetermined number of times, followed by one or more etches. For example, passivation by the air/water may be performed every 100 hours, while the etching with the fluorinated gas may be performed at 1000 hours or at a predetermined Preventive Maintenance (PM) time and/or Post-Vent Conditioning (PVC).

The one or more gases 150, for example, may be introduced in a tunnel region or any other upstream elements associated with the beamline assembly 104, such as corrector magnets or other elements. The one or more gases 150 may be further or alternatively introduced to downstream elements, such as a beam tunnel. For example, the present disclosure may be implemented downstream of the ion source 108 and may be accomplished using various nozzles, tubing, or other gas distributors. The manifold distributor 164 of FIG. 3 may comprise a manifold or any conduit that directs the one or more gases 150 throughout a desired region or directed at desired locations anywhere throughout the ion implantation system 100 of FIG. 1. In another example, the ion beam 112 (e.g., the high-power ion beam 180 of FIG. 4) may comprise an argon ion beam configured to introduce heat and/or bombard the one or more regions.

Figure 6:
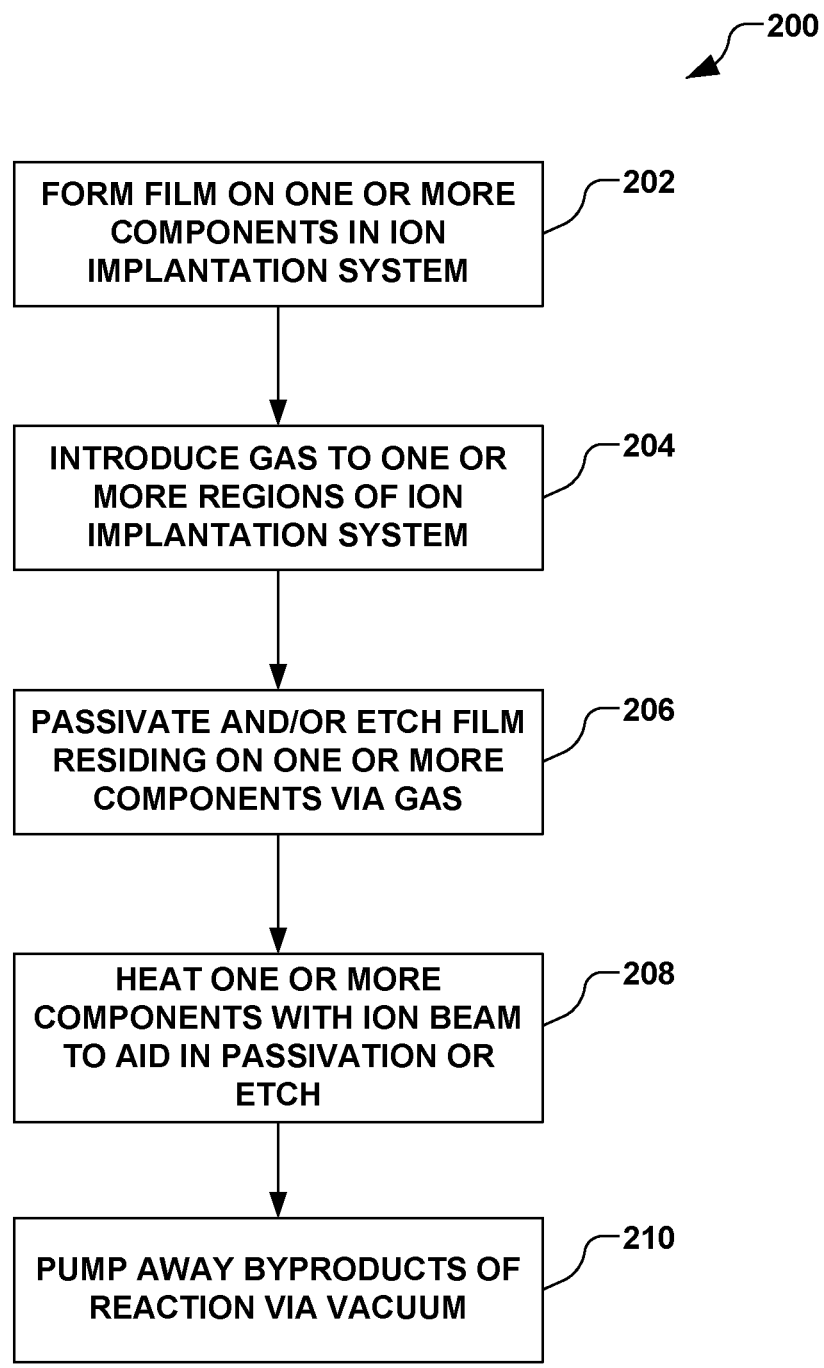
FIG. 6 illustrates an exemplary method for stabilizing and cleaning films in an ion implantation system.

In another aspect of the disclosure, FIG. 6 illustrates a method 200 for mitigating a deposition of a film on one or more components of an ion implantation system. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 200 shown in FIG. 6 illustrates forming a film on one or more components in an ion implantation system in act 202. The film, for example, may be a byproduct of an ion implantation performed on a workpiece, whereby various species or other components of an ion beam are deposited or otherwise formed on the one or more components. The one or more components, for example, may comprise various electrodes or components of an AEF, as described above.

In act 204, a gas, such as air, water vapor, or a fluorine-containing gas is introduced to one or more regions associated with the one or more components of the ion implantation system. In act 206, the gas is reacted with the film, whereby the film is passivated and/or etched. Optionally, in act 208, the one or more components are heated by the ion beam (e.g., by beam strike) or by associated heaters, whereby the heat from the ion beam or associated heaters aid in the passivation and/or etching of act 206. In act 210, byproducts of the reaction of acts 206 and heating of act 208 are pumped out of the ion implantation system, thereby removing contaminants from the system.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   an ion source configured form an ion beam;
   an angular energy filter (AEF) having an AEF region associated therewith;
   a gas source configured to supply a gas to the AEF region, wherein the gas source is configured to passivate and/or etch a film residing on the AEF via a reaction of the film with the gas; and
   a manifold distributor associated with the AEF, wherein the AEF comprises one or more AEF electrodes, and wherein the manifold distributor is operably coupled to the gas source and configured to supply the gas to the one or more AEF electrodes.

2. The ion implantation system of claim 1, wherein the gas source comprises one or more of an oxidizing gas source and a fluorine-containing gas source configured to selectively supply a respective oxidizing gas and fluorine-containing gas to the AEF region.

3. The ion implantation system of claim 2, wherein the fluorine-containing gas comprises one or more of $NF_3$ and $XeF_2$.

4. The ion implantation system of claim 2, wherein the oxidizing gas comprises one or more of air and water.

5. The ion implantation system of claim 1, wherein the gas source is configured to selectively supply the gas to the AEF region concurrent with a formation of the ion beam, and wherein heat associated with the ion beam is configured to heat the AEF to assist in the passivation and/or etching of the film residing on the AEF.

6. The ion implantation system of claim 1, wherein the manifold distributor comprises a tube having a plurality of holes defined therein, wherein the plurality of holes are configured to disperse the gas to the one or more AEF electrodes.

7. The ion implantation system of claim 1, further comprising an auxiliary heater configured to selectively heat the AEF.

8. An ion implantation system, comprising:
   an ion source configured form an ion beam;
   one or more components positioned downstream of the ion source, the one or more components comprising at least an angular energy filter (AEF);
   a gas source configured to supply a gas to one or more regions associated with the respective one or more components, wherein the gas source is configured to passivate and/or etch a film residing on the one or more components via a reaction of the film with the gas; and
   a manifold distributor associated with the AEF, wherein the AEF comprises one or more AEF electrodes, and wherein the manifold distributor is operably coupled to the gas source and configured to supply the gas to the one or more AEF electrodes.

9. The ion implantation system of claim 8, wherein the gas source comprises one or more of an oxidizing gas source and a fluorine-containing gas source configured to selectively supply a respective oxidizing gas and fluorine-containing gas to the one or more regions.

10. The ion implantation system of claim 9, wherein the fluorine-containing gas comprises one or more of $NF_3$ and $XeF_2$.

11. The ion implantation system of claim 9, wherein the oxidizing gas comprises one or more of air and water.

12. The ion implantation system of claim 8, further comprising wherein the gas source is configured to selectively supply the gas to the one or more regions concurrent with a formation of the ion beam, and wherein heat associated with the ion beam is configured to heat the one or more components to assist in the passivation and/or etching of the film residing on the one or more components.

13. The ion implantation system of claim 8, further comprising an auxiliary heater configured to selectively heat the one or more components and to accelerate the reaction of the film with the gas.

14. The ion implantation system of claim 8, wherein the manifold distributor comprises a tube having a plurality of holes defined therein, wherein the plurality of holes are configured to disperse the gas to the one or more AEF electrodes.

15. A method for mitigating a deposition of a film on an angular energy filter (AEF), the method comprising:
   supplying a gas to one or more AEF electrodes of the AEF via a manifold distributor associated with the AEF, wherein the gas is configured to passivate and/or etch the film via a reaction of the film with the gas.

16. The method of claim 15, wherein the gas comprises one or more of $NF_3$ and $XeF_2$, air, and water.

17. The method of claim 15, further comprising evacuating the ion implantation system, thereby removing one or more byproducts of the reaction of the film with the gas from the ion implantation system.

18. The method of claim 17, further comprising forming an ion beam, wherein supplying the gas and evacuating the ion implantation system is performed in-situ.

19. The method of claim 15, further comprising forming an ion beam, wherein heat associated with the ion beam is configured to heat the one or more AEF electrodes to assist in the passivation and/or etching of the film.

20. The ion implantation system of claim 15, wherein the manifold distributor comprises a tube having a plurality of holes defined therein, wherein the plurality of holes are configured to disperse the gas to the one or more AEF electrodes.

* * * * *